United States Patent
Yamanaka et al.

(10) Patent No.: US 9,119,311 B2
(45) Date of Patent: Aug. 25, 2015

(54) ELECTRONIC DEVICE HAVING WATERPROOF STRUCTURE

(71) Applicant: FUJITSU LIMITED, Kawasaki-shi, Kanagawa (JP)

(72) Inventors: Masaki Yamanaka, Ishikari (JP); Hiroshi Kubo, Sapporo (JP); Takeshi Komuro, Kita-hiroshima (JP); Manabu Hongo, Kawasaki (JP); Masahiro Fukuhara, Sapporo (JP); Hiroyuki Takita, Sapporo (JP)

(73) Assignee: FUJITSU LIMITED, Kawasaki (JP)

( * ) Notice: Subject to any disclaimer, the term of this patent is extended or adjusted under 35 U.S.C. 154(b) by 60 days.

(21) Appl. No.: 13/729,607

(22) Filed: Dec. 28, 2012

(65) Prior Publication Data

US 2013/0176666 A1    Jul. 11, 2013

(30) Foreign Application Priority Data

Jan. 10, 2012  (JP) ................................. 2012-002499

(51) Int. Cl.
| | |
|---|---|
| *H01R 13/502* | (2006.01) |
| *H05K 5/00* | (2006.01) |
| *H05K 5/06* | (2006.01) |
| *G06F 1/16* | (2006.01) |
| *H04M 1/02* | (2006.01) |
| *H04M 1/18* | (2006.01) |

(52) U.S. Cl.
CPC .............. *H05K 5/061* (2013.01); *G06F 1/1626* (2013.01); *G06F 1/1656* (2013.01); *H04M 1/026* (2013.01); *H04M 1/18* (2013.01)

(58) Field of Classification Search
None
See application file for complete search history.

(56) References Cited

U.S. PATENT DOCUMENTS

| 5,414,597 | A  | * | 5/1995  | Lindland et al. ............... 361/816 |
| 6,313,400 | B1 | * | 11/2001 | Mosquera et al. ............ 174/363 |
| 7,563,992 | B2 | * | 7/2009  | Lawlyes et al. ............... 174/561 |
| 7,791,902 | B2 | * | 9/2010  | Peets ............................. 361/818 |
| 2005/0082081 | A1 | * | 4/2005 | Marcou et al. .................. 174/67 |
| 2008/0041624 | A1 | * | 2/2008 | Sasaki et al. .................. 174/520 |

(Continued)

FOREIGN PATENT DOCUMENTS

| JP | 2003-204954 A | 7/2003 |
| JP | 2007-143909 A | 6/2007 |

(Continued)

*Primary Examiner* — Hoa C Nguyen
*Assistant Examiner* — Xanthia C Cunningham
(74) *Attorney, Agent, or Firm* — Westerman, Hattori, Daniels & Adrian, LLP (57) ABSTRACT

An electronic device includes a housing including an opening-portion and an annular-projection provided in the vicinity of the opening-portion from the housing, the annular-projection projecting so as to surround a periphery of the opening-portion, a frame member including a tubular-portion having an outer surface that faces the annular-projection to be fitted with the annular-projection, a top plate exposed from the opening-portion with the tubular-portion fitted with the annular-projection, an extension-portion extending from the outer surface of the tubular-portion, the tubular-portion being expanded toward the annular-projection when a pressing force is applied to a surface of the top plate exposed from the opening-portion with the annular-projection and the tubular-portion fitted with each other, and an O-ring that contacts entire peripheries of the outer surface of the tubular-portion and an inner surface of the annular-projection.

9 Claims, 11 Drawing Sheets

(56) References Cited

U.S. PATENT DOCUMENTS

| | | | |
|---|---|---|---|
| 2009/0175020 A1* | 7/2009 | Zadesky | 361/818 |
| 2009/0303666 A1* | 12/2009 | Brizes et al. | 361/658 |
| 2010/0108374 A1* | 5/2010 | Korcz et al. | 174/520 |
| 2010/0124846 A1* | 5/2010 | Peets | 439/607.18 |
| 2011/0079413 A1* | 4/2011 | Masumoto | 174/50 |
| 2011/0265341 A1* | 11/2011 | Young | 33/613 |
| 2011/0315442 A1* | 12/2011 | Nolting et al. | 174/652 |

FOREIGN PATENT DOCUMENTS

| | | |
|---|---|---|
| JP | 2010-74439 A | 4/2010 |
| JP | 2011-205498 A | 10/2011 |

* cited by examiner

ELECTRONIC DEVICE HAVING WATERPROOF STRUCTURE

CROSS-REFERENCE TO RELATED APPLICATION

This application is based upon and claims the benefit of priority of the prior Japanese Patent Application No. 2012-2499, filed on Jan. 10, 2012, the entire contents of which are incorporated herein by reference.

FIELD

The embodiments discussed herein are related to an electronic device.

BACKGROUND

In recent years, electronic devices that are easily portable such as tablet terminals and personal digital assistances (PDAs) have been widely used. Such portable electronic devices may become wet with water such as rain during outdoor use, and therefore preferably have waterproof performance. Some of the electronic devices are intended for use in bathrooms or the like, and preferably have higher waterproof performance.

In particular, members that are separate from a housing and exposed to the outside and that are subjected to an external pressure may be warped by the external pressure to cause a gap, which may allow entry of water. Examples of such members include a fingerprint sensor. In tablet terminals with a large area, a significant warp may be caused upon receiving a pressing force, which poses a higher risk of causing a gap.

In order to secure waterproof property around a fingerprint sensor in an electronic device, it has been proposed to affix a packing material to a substrate on which a fingerprint sensor is mounted to fix the packing material to an outer case. It has also been proposed to affix a fingerprint sensor and an outer case to each other using an adhesive.

Figure 19:
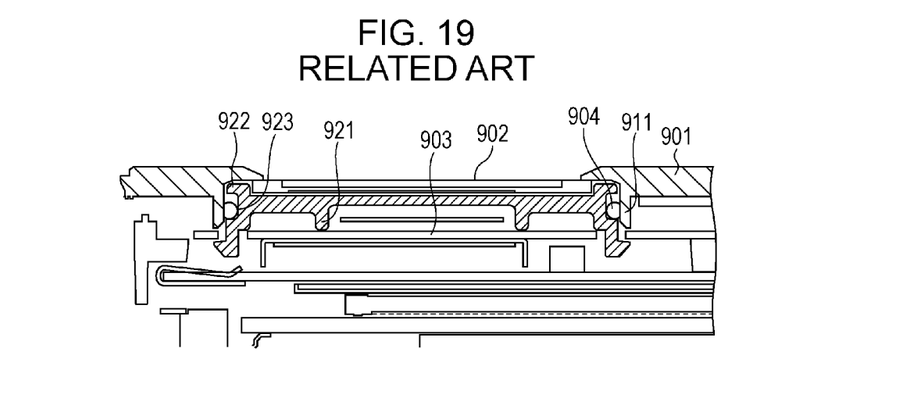
FIG. 19 is a cross-sectional view of an example of a waterproof structure for an electronic device according to the related art.

An electronic device having a structure illustrated in FIG. 19 has been proposed as a waterproof structure for an electronic device. FIG. 19 illustrates an example of a waterproof structure for an electronic device according to the related art. In the waterproof structure according to the related art, a fingerprint sensor 902 is fixed to a substrate 903 provided inside, and an outer case 901 having a projection 911 surrounding the fingerprint sensor 902 is placed so that an O-ring 904 is interposed between the projection 911 and the fingerprint sensor 902. According to the related art, the O-ring 904 provided between the fingerprint sensor 902 and the projection 911 provided inside the housing suppresses entry of water and dust.

Examples of the related art are described in Japanese Laid-open Patent Publication No. 2007-143909, Japanese Laid-open Patent Publication No. 2003-204954, and Japanese Laid-open Patent Publication No. 2010-74439.

In the case where a water stop member is affixed using an adhesive material, however, the adhesive may be peeled because of a reduction in adhesion or a pressing force. Therefore, it is difficult to secure reliability in waterproof performance and dust-proof performance with the related art in which a water stop member is affixed using an adhesive material.

In the mechanism illustrated in FIG. 19, meanwhile, the fingerprint sensor 902 is warped about a support leg 921 by a pressing force applied to the fingerprint sensor 902, which moves an upper end portion 922 in the direction away from the projection 911 of the outer case 901. Then, an upright wall 923 of the fingerprint sensor 902 which interposes the O-ring 904 is deformed inward. This may increase the distance between the upright wall 923 and the projection 911, reduce a force to compress the O-ring 904, and cause a gap around the O-ring 904. In electronic devices in which the outer case 901 has a large area such as tablet terminals, in particular, the outer case 901 is warped significantly. Therefore, the upright wall 923 of the fingerprint sensor 902 is deformed significantly when the fingerprint sensor 902 is pressed, and the pressure applied to the O-ring 904 is highly likely to be reduced. Thus, it is also difficult to secure reliability in waterproof performance and dust-proof performance with the related art illustrated in FIG. 19.

The disclosed technology has been made in view of the foregoing, and therefore has an object to provide an electronic device that achieves seal while securing reliability in waterproof performance and dust-proof performance.

SUMMARY

According to an aspect of the application, an apparatus includes a housing including an opening portion and an annular projection provided around the opening portion, a frame member including a tubular portion having an outer surface that faces the annular projection to be fitted with the annular projection, a top plate exposed from the opening portion with the tubular portion fitted with the annular projection, an extension portion extending from the outer surface of the tubular portion, the tubular portion being expanded toward the annular projection when a pressing force is applied to a surface of the top plate exposed from the opening portion with the annular projection and the tubular portion fitted with each other, and an O-ring that contacts entire peripheries of the outer surface of the tubular portion and an inner surface of the annular projection.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Electronic devices according to embodiments disclosed herein are described in detail below with reference to the drawings. The electronic device disclosed herein is not limited by the following embodiments. Although the electronic device is specifically a tablet terminal in the following description, the electronic device is not limited thereto, and may be other devices for which waterproof property and dust-proof property are desired.

First Embodiment

Figure 1:
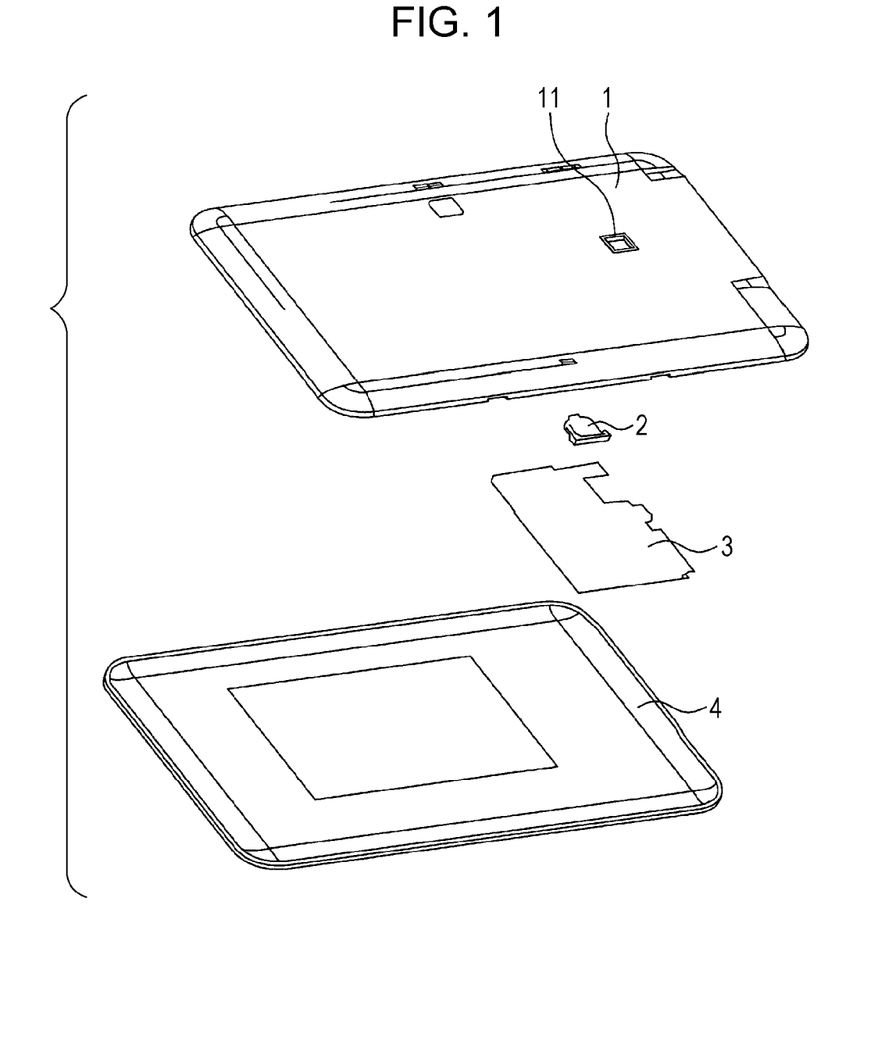
FIG. 1 is an exploded perspective view of an electronic device according to a first embodiment.
Figure 2:
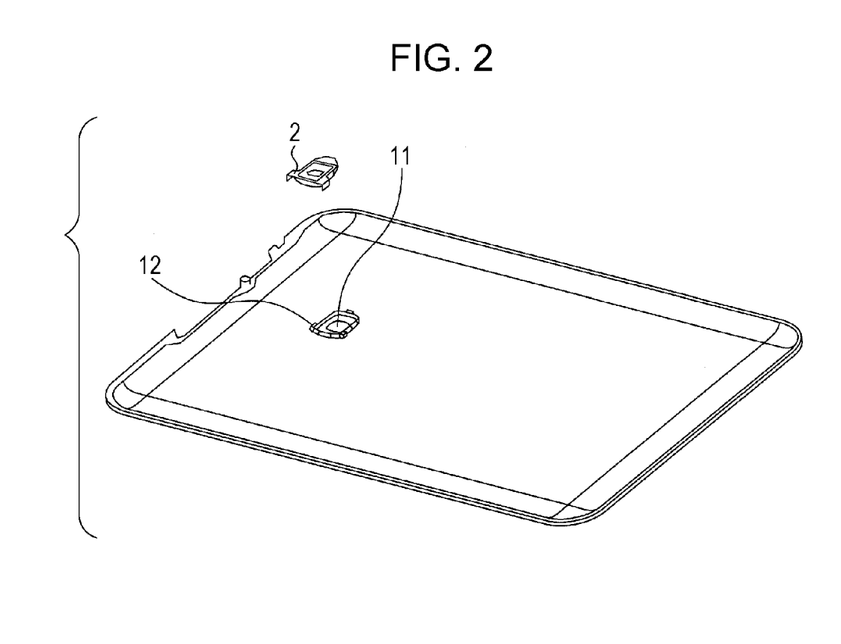
FIG. 2 is an exploded perspective view of a rear case as seen from the inside of the electronic device according to the first embodiment.

FIG. 1 is an exploded perspective view of an electronic device according to a first embodiment. FIG. 2 is an exploded perspective view of a rear case as seen from the inside of the electronic device according to the first embodiment.

As illustrated in FIG. 1, the electronic device according to the embodiment includes a rear case 1, a fingerprint sensor frame 2, a substrate 3, and a front case 4.

The rear case 1 has an opening portion 11. As illustrated in FIG. 2, the rear case 1 has an annular projection 12 provided on the inner side of the rear case 1 to surround the periphery of the opening portion 11. The rear case 1 corresponds to an example of the "housing".

The fingerprint sensor frame 2 is a fixation stand on which a fingerprint sensor is to be mounted. The fingerprint sensor frame 2 is disposed so as to contact the rear case 1 from the inner side of the rear case 1. A fingerprint sensor configured to read a fingerprint is disposed on the fingerprint sensor frame 2 to face outward from the opening portion 11. Specifically, the fingerprint sensor frame 2 is fitted with the annular projection 12 of the rear case 1. The structure of the fingerprint sensor frame 2 and the annular projection 12 of the rear case 1 and fitting between the fingerprint sensor frame 2 and the annular projection 12 are described in detail later. The fingerprint sensor frame 2 corresponds to an example of the "frame member".

Further, the substrate 3 is disposed on the side of the fingerprint sensor frame 2 opposite to the rear case 1. A circuit or the like that processes information such as a fingerprint input from the fingerprint sensor frame 2 is disposed on the substrate 3.

The rear case 1 and the front case 4 are fitted with each other with the fingerprint sensor frame 2 and the substrate 3 interposed between the rear case 1 and the front case 4 to form a housing of a tablet terminal.

Figure 3:
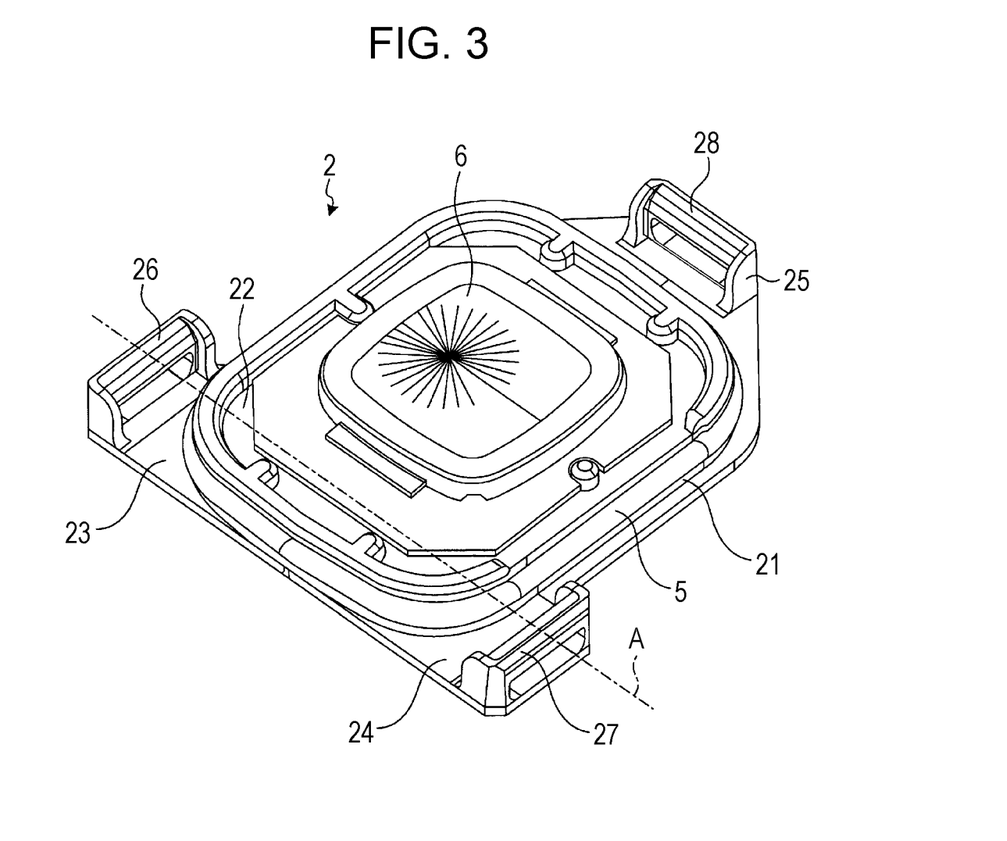
FIG. 3 is a perspective view of a fingerprint sensor frame on the side of a fingerprint sensor.
Figure 4:
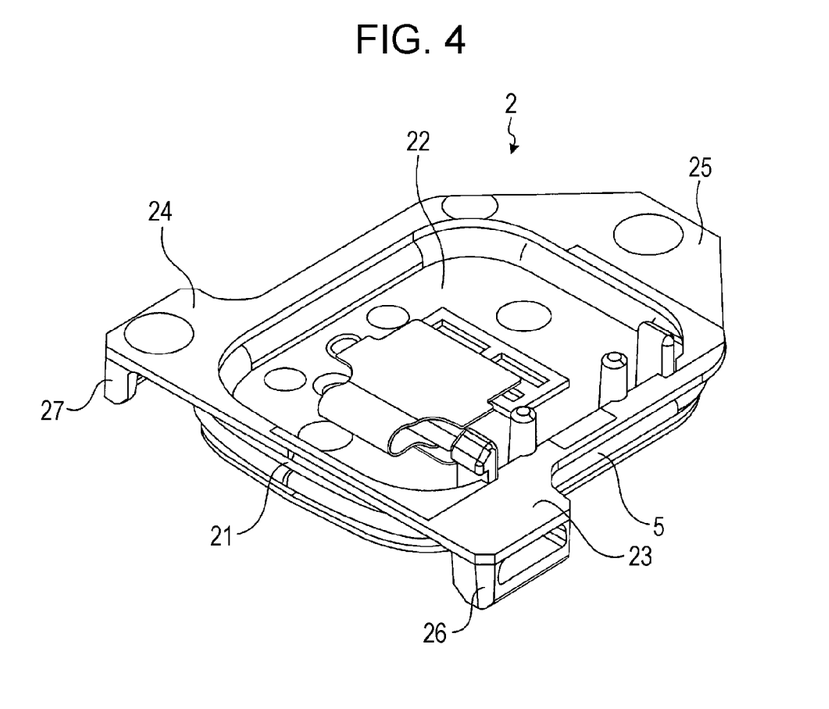
FIG. 4 is a perspective view of the fingerprint sensor frame on the side of a substrate.

Next, the structure of the fingerprint sensor frame 2 is discussed in detail with reference to FIGS. 3 and 4. FIG. 3 is a perspective view of the fingerprint sensor frame 2 on the fingerprint sensor side. FIG. 4 is a perspective view of the fingerprint sensor frame 2 on the substrate 3 side.

As illustrated in FIG. 3, the fingerprint sensor frame 2 includes an upright wall 21 having a surface that faces an inner wall 16 of the annular projection 12 when the fingerprint sensor frame 2 is fitted with the annular projection 12. The upright wall 21 corresponds to an example of the "tubular portion". In the embodiment, the upright wall 21 is inclined in the direction away from the opening portion 11 as the upright wall 21 extends away from the rear case 1 with the rear case 1 and the fingerprint sensor frame 2 fitted with each other. In the embodiment, further, the upright wall 21 becomes thinner in the direction away from the opening portion 11 as the upright wall 21 extends away from the rear case 1 with the rear case 1 and the fingerprint sensor frame 2 fitted with each other. The reason for the upright wall 21 having an inclination and becoming thinner is to make the upright wall 21 easily movable away from the opening portion 11 in the case where a pressing force is applied from the rear case 1 side. That is, the upright wall 21 may only be shaped so as to be easily movable away from the opening portion 11 in the case where a pressing force is applied from the rear case 1 side. For example, the upright wall 21 may be structured to either be inclined or become thinner.

As illustrated in FIG. 3, the fingerprint sensor frame 2 has a top plate 22 provided on the opening portion 11 side of a tube formed by the upright wall 21. A fingerprint sensor 6 is disposed on a surface of the top plate 22 facing the rear case 1. The fingerprint sensor 6 disposed on the top plate 22 is exposed to the outside from the opening portion 11 with the fingerprint sensor frame 2 fitted with the annular projection 12. A surface of the fingerprint sensor 6 for placement of a finger is positioned to be substantially flush with an outside surface of the rear case 1.

The rigidity of the top plate 22 is set to be higher than the rigidity of the upright wall 21. For example, a member forming the top plate 22 may have higher rigidity than the rigidity of a member forming the upright wall 21. The top plate 22 may be formed to be thicker than the upright wall 21 in order to enhance the rigidity of the top plate 22.

As illustrated in FIGS. 3 and 4, the fingerprint sensor frame 2 has extension portions 23 to 25 extending outward from the upright wall 21 in directions perpendicular to the upright wall 21. The respective directions of extension of the extension portion 23 and a hook receiver 26 are on the same line A, and are opposite to each other. A hook receiver 28 extends in the direction orthogonal to the respective directions of extension of the hook receiver 26 and a hook receiver 27.

The extension portion 23 has the hook receiver 26 which projects toward the rear case 1 with the annular projection 12 and the fingerprint sensor frame 2 fitted with each other. In the embodiment, as illustrated in FIG. 3, the hook receiver 26 projects from the extension portion 23 toward the rear case 1, and has a hole provided in the projected portion to receive a hook. The length of the hook receiver 26 in the longitudinal direction substantially coincides with the length of a hook 13, which is to be engaged with the hook receiver 26, in the longitudinal direction.

The extension portion 24 has the hook receiver 27 which projects toward the rear case 1 with the annular projection 12 and the fingerprint sensor frame 2 fitted with each other. The hook receiver 27 has the same structure as that of the hook receiver 26. The length of the hook receiver 27 in the longitudinal direction also substantially coincides with the length of a hook 14, which is to be engaged with the hook receiver 27, in the longitudinal direction.

The extension portion 25 has the hook receiver 28 which projects toward the rear case 1 with the annular projection 12 and the fingerprint sensor frame 2 fitted with each other. The hook receiver 28 has the same structure as that of the hook receiver 26. The length of the hook receiver 28 in the longitudinal direction may not coincide with the length of a hook 15, which is to be engaged with the hook receiver 28, in the longitudinal direction.

Figure 5:
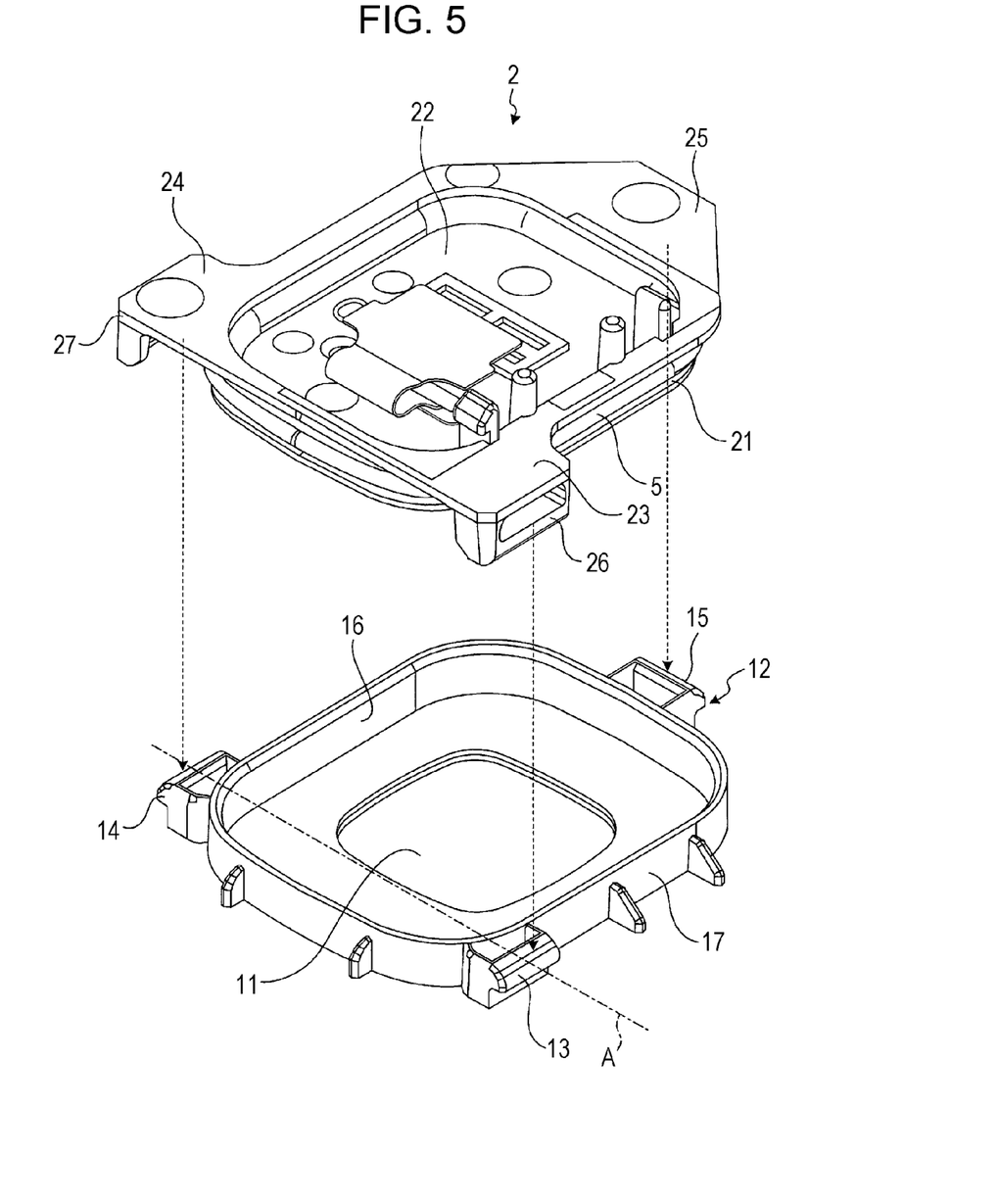
FIG. 5 is an enlarged perspective view of the fingerprint sensor frame and a projection of the rear case illustrated in FIG. 2.
Figure 6:
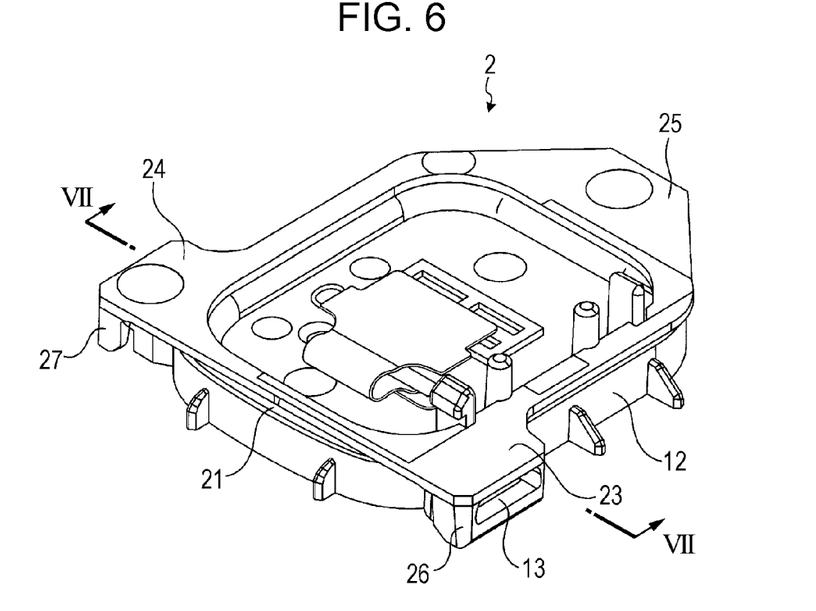
FIG. 6 is a perspective view of the fingerprint sensor frame and the projection of the rear case fitted with each other.

FIG. 5 is an enlarged perspective view of the fingerprint sensor frame 2 and the projection of the rear case 1 illustrated in FIG. 2. FIG. 6 is a perspective view of the fingerprint sensor frame 2 and the projection of the rear case 1 fitted with each other. When the fingerprint sensor frame 2 is moved in the direction of the dotted arrows illustrated in FIG. 5 from the state of FIG. 5 so that the fingerprint sensor frame 2 and the rear case 1 are fitted with each other, the state of FIG. 6 is achieved.

The fingerprint sensor frame 2 in FIG. 5 is the same as the fingerprint sensor frame 2 illustrated in FIG. 4.

As illustrated in FIG. 5, the annular projection 12 provided on the rear case 1 has the hooks 13 to 15 which project in directions perpendicular to an outer wall 17. In the embodiment, the direction of extension of the hook 13 and the direction of extension of the hook 14 are on the same line A, and are opposite to each other. The hook 15 extends in the direction orthogonal to the line A which coincides with the direction of extension of the hook 13 and the hook 14.

Then, as illustrated in FIG. 6, the annular projection 12 of the rear case 1 and the fingerprint sensor frame 2 are fitted with each other. At this time, the hook receiver 26 engages with the hook 13. As discussed above, the hook 13 and the hook receiver 26 coincide with each other in length in the longitudinal direction. Thus, in the case where the hook 13 and the hook receiver 26 engage with each other, the hook 13 is fitted with the hook receiver 26 with no gap in the longitudinal direction. The hook receiver 27 engages with the hook 14. As discussed above, the hook 14 and the hook receiver 27 coincide with each other in length in the longitudinal direction. Thus, in the case where the hook receiver 27 and the hook 14 engage with each other, the hook 14 is fitted with the hook receiver 27 with no gap in the longitudinal direction. The hook receiver 28 engages with the hook 15. As discussed above, the hook receiver 28 may not coincide with the hook 15 in length in the longitudinal direction. That is, in the case where the hook receiver 28 and the hook 15 engage with each other, there may be a gap in the longitudinal direction between the hook 15 and the hook receiver 28.

An O-ring 5 is disposed so as to surround the periphery of the upright wall 21. As illustrated in FIGS. 3 and 5, in the case where the annular projection 12 of the rear case 1 and the fingerprint sensor frame 2 are fitted with each other, the O-ring 5 is interposed between the upright wall 21 of the fingerprint sensor frame 2 and the inner wall 16 of the annular projection 12 of the rear case 1. With the O-ring 5 thus interposed while being pressed by both the upright wall 21 and the inner wall 16, the O-ring 5 serves as a water stop mechanism that fills a gap between the rear case 1 and the fingerprint sensor frame 2 formed around the upright wall 21 to suppress entry of water, and also serves as a seal that suppresses entry of dust or the like.

Figure 7:
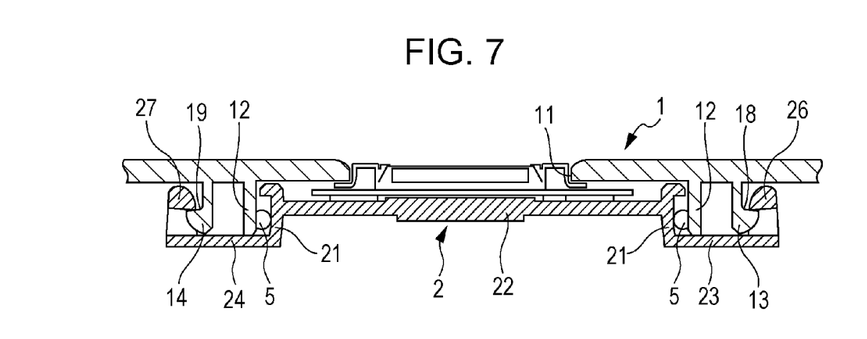
FIG. 7 is a cross-sectional view taken along the line VII-VII of FIG. 6.

FIG. 7 is a cross-sectional view taken along the line VII-VII of FIG. 6.

As illustrated in FIG. 7, with the rear case 1 and the fingerprint sensor frame 2 fitted with each other, the hook 13 and the hook receiver 26 engage with each other, and the hook 14 and the hook receiver 27 engage with each other. The O-ring 5, which is interposed between the upright wall 21 and the annular projection 12, stops entry of water from the opening portion 11 to a space further inward than the O-ring 5, and also suppresses entry of dust or the like.

As discussed above, the upright wall 21 is inclined in the direction away from the opening portion 11 as the upright wall 21 extends away from the rear case 1. In the embodiment, further, the upright wall 21 becomes thinner in the direction away from the opening portion 11 as the upright wall 21 extends away from the rear case 1 with the rear case 1 and the fingerprint sensor frame 2 fitted with each other. The top plate 22 is formed to have high rigidity compared to the upright wall 21. Further, the hook 13 has an inclination 18 so that the hook receiver 26 does not move toward the opening portion 11 from the state of FIG. 7. In addition, the hook 14 has an inclination 19 so that the hook receiver 27 does not move toward the opening portion 11 from the state of FIG. 7. The hook 13 and the hook 14 may only have a mechanism that does not allow the hook receiver 26 and the hook receiver 27 to move toward the opening portion 11 from the state of FIG. 7. For example, the hook 13 and the hook 14 may have a projection or the like.

Figure 8:
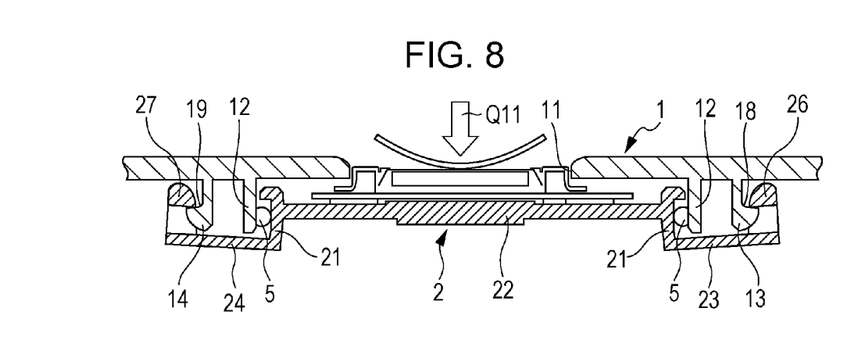
FIG. 8 illustrates a state in which a pressing force is applied to the fingerprint sensor frame according to the first embodiment.

FIG. 8 illustrates a state in which a pressing force is applied to the fingerprint sensor frame 2 according to the first embodiment. Specifically, FIG. 8 illustrates a state in which a pressing force Q11 is applied to the fingerprint sensor frame 2 in the state of FIG. 7. The arc provided ahead of the arrow indicating the pressing force Q11 in FIG. 8 indicates a portion subjected to the pressing force Q11. In this case, the pressing force Q11 is applied only to the fingerprint sensor frame 2, and not to the rear case 1.

When the pressing force Q11 is applied to the fingerprint sensor frame 2 as illustrated in FIG. 8, the upright wall 21 is opened outward before the top plate 22 is warped since the rigidity of the top plate 22 is higher than the rigidity of the upright wall 21. Consequently, the upright wall 21 is moved in the direction toward the annular projection 12. This causes the O-ring 5 to be pressed against the annular projection 12 with a stronger force from the upright wall 21, which increases the seal performance, such as water stoppage and dust-proof property, of the O-ring 5.

Figure 9:
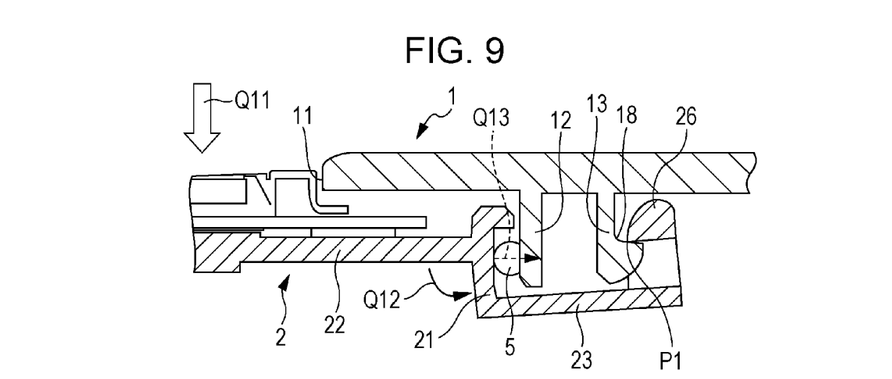
FIG. 9 illustrates transfer of a force in the case where a pressing force is applied to the fingerprint sensor frame according to the first embodiment.

Transfer of a force at the time when the pressing force Q11 is applied to the fingerprint sensor frame 2 is described in detail with reference to FIG. 9. When the pressing force Q11 is applied to the fingerprint sensor frame 2, a force in the direction away from the rear case 1 is exerted on the upright wall 21. At this time, the hook 13 and the hook receiver 26 engage with each other, the hook 14 and the hook receiver 27 engage with each other, and both the hook receiver 26 and the hook receiver 27 are not movable toward the opening portion 11 because of the inclination 18 and the inclination 19. Thus, the hook receiver 26 and the hook receiver 27 are not moved when the pressing force Q11 is applied to the fingerprint sensor frame 2. Thus, a force in the direction of rotating the upright wall 21 about a point P1 is applied to the upright wall 21. Since the rigidity of the top plate 22 is higher than the rigidity of the upright wall 21, the upright wall 21 is opened outward about the point P1 as indicated by the arrow Q12 before the top plate 22 is warped. A pressing force Q13 is applied to the O-ring 5 by the movement of the upright wall 21 in the direction of the arrow Q12. This causes the O-ring 5 to be pressed against the annular projection 12. With the O-ring 5 thus pressed against the annular projection 12 to be compressed, the seal is strengthened to keep waterproof property and dust-proof property. Thus, no gap is formed around the O-ring 5 unlike the related art even if a pressing force is applied from the rear case 1 side, which makes it possible to secure stable waterproof property and dust-proof property.

Although movement of the upright wall 21 in the direction of the line VII-VII of FIG. 6 during application of a pressing force has been described above with reference to FIGS. 7 to 9, the upright wall 21 is also moved in the same manner in the direction orthogonal to the line VII-VII.

That is, in the case where a pressing force is applied to the fingerprint sensor frame 2 from the rear case 1 side, the hook 15 and the hook receiver 28 work in the same manner as the hook 13 and the hook receiver 26 and the hook 14 and the hook receiver 27. The upright wall 21 is moved in the direction away from the opening portion 11 about a point at which the hook 15 and the hook receiver 28 engage with each other to press the O-ring 5 against the annular projection 12.

On the other hand, no hook and hook receiver are provided on the side opposite to the hook 15 and the hook receiver 28. However, the hook 13 and the hook receiver 26, and the hook receiver 14 and the hook receiver 27, coincide with each other in length in the longitudinal direction, and engage with each other with no gap in the longitudinal direction. Therefore, the hook 13 and the hook receiver 26 and the hook receiver 14 and the hook receiver 27 suppress movement of the entire fingerprint sensor frame 2 to the side opposite to the hook 15 and the hook receiver 28. Then, the upright wall 21 is rotated in the direction away from the opening portion 11 about contact points at which the hook 13 and the hook receiver 26 and the hook 14 and the hook receiver 27 engage with each other to press the O-ring 5 against the annular projection 12.

In the embodiment, three hooks and hook receivers are disposed for reason of arrangement of the fingerprint sensor frame 2. However, three or more hooks and hook receivers may be disposed. For example, in the case where a hook and a hook receiver are disposed on the side opposite to the hook 15 and the hook receiver 28, the hook 13 and the hook receiver 26 and the hook 14 and the hook receiver 27 may no longer play a role as a hook and a hook receiver on the side opposite to the hook 15 and the hook receiver 28. Thus, the hook 13 and the hook receiver 26 and the hook 14 and the hook receiver 27 may not coincide with each other in length in the longitudinal direction.

Figure 10:
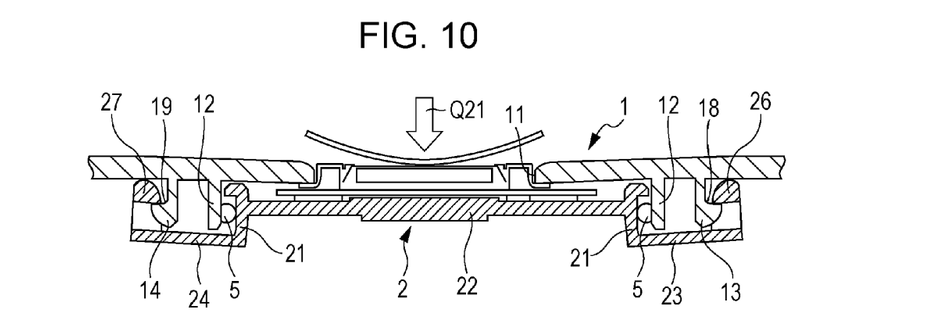
FIG. 10 illustrates a state in which a pressing force is applied to both the fingerprint sensor frame and the rear case.

Next, a case where a pressing force is applied not only to the fingerprint sensor frame 2 but also to the rear case 1 surrounding the fingerprint sensor frame 2 is described with reference to FIG. 10. FIG. 10 illustrates a state in which a pressing force is applied to both the fingerprint sensor frame 2 and the rear case 1.

In this case, as illustrated in FIG. 10, a pressing force Q21 is applied to the fingerprint sensor frame 2 and the periphery of the opening portion 11 of the rear case 1. The arc provided ahead of the arrow indicating the pressing force Q21 indicates a location subjected to the pressing force Q21.

In this case, the upright wall 21 of the fingerprint sensor frame 2 is moved in the direction away form the opening portion 11 in the same manner as when a pressing force is applied only to the fingerprint sensor frame 2.

In this case, further, the pressing force Q21 is also applied to the rear case 1. Therefore, the periphery of the opening portion 11 of the rear case 1 is depressed toward the fingerprint sensor frame 2 as the top plate 22 of the fingerprint sensor frame 2 is depressed. At this time, the annular projection 12 is moved in the direction away from the opening portion 11. In addition, the hook 13 is also moved in the direction away from the opening portion 11.

Figure 11:
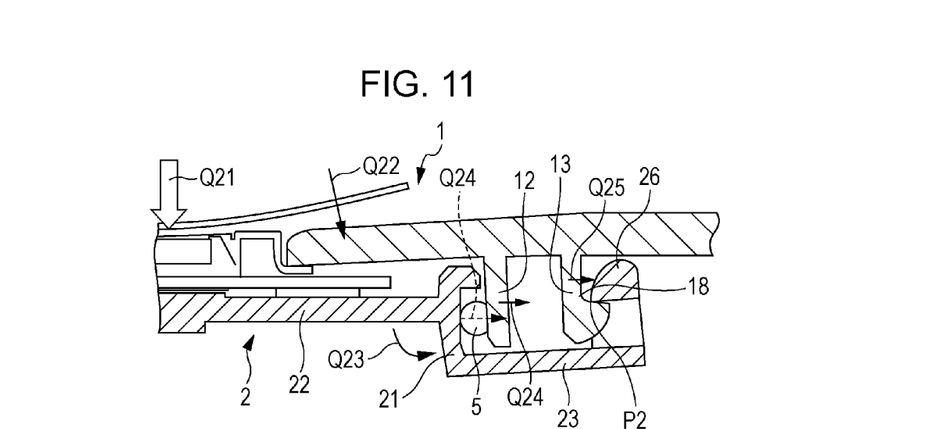
FIG. 11 illustrates transfer of a force in the case where a pressing force is applied to both the fingerprint sensor frame and the rear case.

Transfer of a force in this case is further described with reference to FIG. 11. FIG. 11 illustrates transfer of a force in the case where a pressing force is applied to both the fingerprint sensor frame 2 and the rear case 1.

When the pressing force Q21 is applied, a force Q22 that presses the rear case 1 toward the fingerprint sensor frame 2 is exerted. The upright wall 21 of the fingerprint sensor frame 2 is moved in the direction of the arrow Q23 about a point P2. At this time, the rear case 1 is warped by the force Q22, and the annular projection 12 is moved in the direction of the arrow Q24. In addition, the hook 13 is moved in the direction of the arrow Q25.

With the annular projection 12 and the hook 13 thus moved along with rotation of the upright wall 21, the relative positional relationship between the upright wall 21 and the annular projection 12 is maintained before and after reception of the pressing force Q21. With the relative positional relationship between the upright wall 21 and the annular projection 12 maintained, no deviation is caused in relative positional relationship between the fingerprint sensor 6 and the rear case 1, which suppresses a reduction in fingerprint reading accuracy.

In the electronic device according to the embodiment, as has been described above, when a force is applied to a member having a seal mechanism that uses an O-ring to achieve waterproofness, dust-proofness, or the like from the outside toward the inside of a housing, a wall of the member that has received the pressing force is expanded, which increases a force to press the O-ring from both sides to compress the O-ring. This makes it possible to maintain seal performance in the case where a force is received from the outside, and to secure stability in waterproof performance and dust-proof performance.

In the electronic device according to the embodiment, in addition, the relative positional relationship between a fingerprint sensor and a rear case can be maintained in the case where a pressing force is applied to the rear case as well as to the fingerprint sensor frame. This suppresses a reduction in fingerprint reading accuracy.

Second Embodiment

Next, an electronic device according to a second embodiment is described. The electronic device according to the embodiment is different from that according to the first embodiment in that an annular projection of a rear case to be fitted with a fingerprint sensor frame to interpose an O-ring is integral with hooks.

Figure 12:
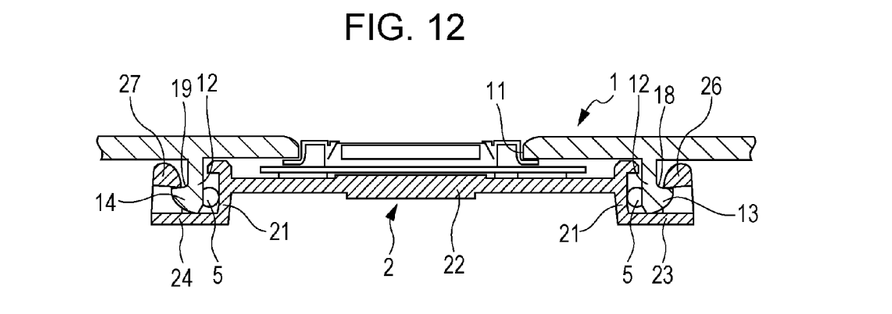
FIG. 12 is a cross-sectional view of an electronic device according to a second embodiment.

FIG. 12 is a cross-sectional view of the electronic device according to the second embodiment. In the embodiment, the hook 13 and the hook 14 are disposed at the distal end of the annular projection 12 at positions at which the hooks 13 and 14 contact the hook receivers 26 and 27, respectively. Although only the hook 13 and the hook 14 are illustrated in FIG. 12, the hook 15 is similarly disposed at the distal end of the annular projection 12 at a position at which the hook 15 contacts the hook receiver 28.

In the case where the rear case 1 and the fingerprint sensor frame 2 are fitted with each other, as illustrated in FIG. 12, the upright wall 21 is fitted inside the annular projection 12, and the hooks 13 to 15 provided at the distal end of the annular projection 12 engage with the hook receivers 26 to 28, respectively, provided on the fingerprint sensor frame 2.

Also in this case, the hook 13 is provided with the inclination 18, and the hook receiver 26 can no further be moved toward the opening portion 11 than the location indicated in FIG. 12. Similarly, the hook 14 is provided with the inclination 19, and the hook receiver 27 can no further be moved toward the opening portion 11 than the location indicated in FIG. 12.

The O-ring 5 is interposed between the upright wall 21 and the annular projection 12.

Figure 13:
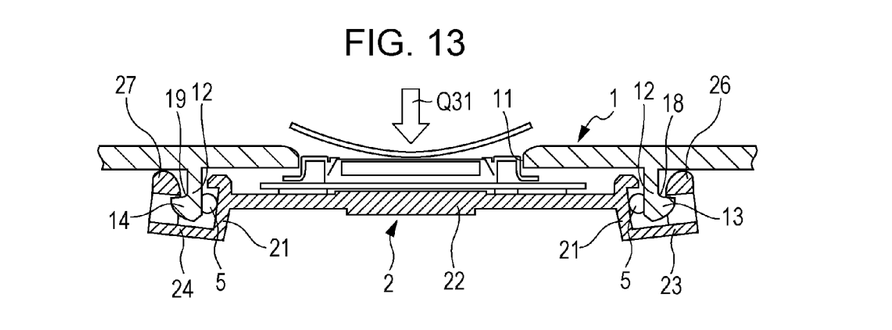
FIG. 13 illustrates a state in which a pressing force is applied to a fingerprint sensor frame according to the second embodiment.

Next, a case where a pressing force is applied to the fingerprint sensor frame 2 according to the embodiment from the rear case 1 side is described with reference to FIG. 13. FIG. 13 illustrates a state in which a pressing force is applied to the fingerprint sensor frame 2 according to the second embodiment.

A pressing force Q31 is applied to the fingerprint sensor frame 2. The arc provided ahead of the arrow indicating the pressing force Q31 indicates a position to which the pressing force Q31 is applied. Also in this case, as in the first embodiment, the top plate 22 is pressed by the pressing force Q31, and the upright wall 21 which has received the pressing force Q31 is moved in the direction away form the opening portion 11.

Figure 14:
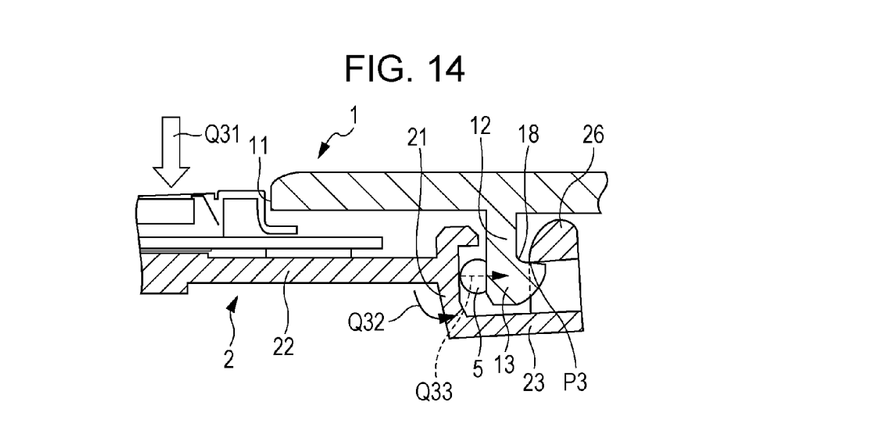
FIG. 14 illustrates transfer of a force in the case where the fingerprint sensor frame according to the second embodiment is subjected to a pressing force.

Next, transfer of a force to the fingerprint sensor frame 2 according to the embodiment at the time when the pressing force Q31 is applied to the fingerprint sensor frame 2 is described in detail with reference to FIG. 14. When the pressing force Q31 is applied to the fingerprint sensor frame 2, a force in the direction away from the rear case 1 is exerted on the upright wall 21. At this time, the hook 13 and the hook receiver 26 engage with each other, the hook 14 and the hook receiver 27 engage with each other, and both the hook receiver 26 and the hook receiver 27 are not movable toward the opening portion 11 because of the inclination 18 and the inclination 19. Thus, the hook receiver 26 and the hook receiver 27 are not moved when the pressing force Q31 is applied to the fingerprint sensor frame 2. Thus, a force in the direction of rotating the upright wall 21 about a point P3 is applied to the upright wall 21. Since the rigidity of the top plate 22 is higher than the rigidity of the upright wall 21, the upright wall 21 is opened outward about the point P3 as indicated by the arrow Q32 before the top plate 22 is warped. A pressing force Q33 is applied to the O-ring 5 by the movement of the upright wall 21 in the direction of the arrow Q32. This causes the O-ring 5 to be pressed against the annular projection 12.

In the electronic device according to the embodiment, as has been described above, when a force is applied to a member having a seal mechanism that uses an O-ring to achieve waterproofness, dust-proofness, or the like from the outside toward the inside of a housing, a wall of the member that has received the pressing force is expanded, which increases a force to press the O-ring from both sides to compress the O-ring. This makes it possible to maintain seal performance in the case where a force is received from the outside, and to secure stability in waterproof performance and dust-proof performance.

In addition, the hooks are disposed on the annular projection of the rear case which interposes the O-ring. Therefore, there may not be a projection for the hooks, which makes it possible to reduce the size of a member having a seal mechanism that uses the O-ring compared to the first embodiment.

Third Embodiment

Next, an electronic device according to a third embodiment is described. The electronic device according to the embodiment is different from that according to the first embodiment in that the extension portions of the fingerprint sensor frame are supported in the rear case from the side opposite to the rear case.

Figure 15:
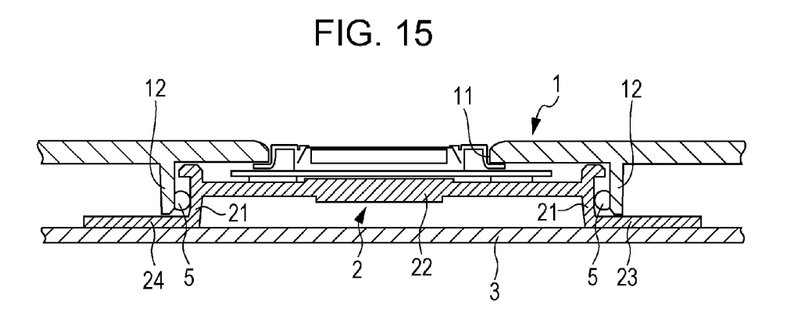
FIG. 15 is a cross-sectional view of an electronic device according to a third embodiment.

FIG. 15 is a cross-sectional view of the electronic device according to the third embodiment. The fingerprint sensor frame 2 according to the embodiment is also shaped in the same manner as that according to the first embodiment.

The rear case 1 has the annular projection 12 to be fitted with the upright wall 21 of the fingerprint sensor frame 2.

As in the first embodiment, the O-ring 5 is interposed between the upright wall 21 and the annular projection 12.

The substrate 3 is disposed so as to contact the extension portions 23 to 25 of the fingerprint sensor frame 2. That is, the substrate 3 supports the extension portions 23 to 25 from the side opposite to the rear case 1. The surface of the substrate 3 is so smooth that the extension portions 23 to 25 can slidably move over the surface of the substrate 3.

Figure 16:
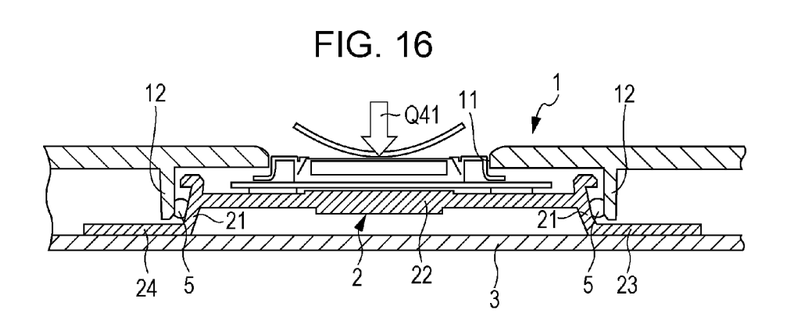
FIG. 16 illustrates a state in which a pressing force is applied to a fingerprint sensor frame according to the third embodiment.

Next, a case where a pressing force is applied to the fingerprint sensor frame 2 according to the embodiment from the rear case 1 side is described with reference to FIG. 16. FIG. 16 illustrates a state in which the fingerprint sensor frame 2 according to the third embodiment is subjected to a pressing force.

A pressing force Q41 is applied to the fingerprint sensor frame 2. The arc provided ahead of the arrow indicating the pressing force Q41 indicates a position to which the pressing force Q41 is applied. In this case, the top plate 22 is pressed by the pressing force Q41, and the upright wall 21, the extension portion 23, and the extension portion 24 are pressed against the substrate 3 upon receiving the pressing force Q41. Since the rigidity of the top plate 22 is higher than that of the upright wall 21, the upright wall 21 is expanded to be away from the opening portion 11 before the top plate 22 is warped. This causes the upright wall 21 to be moved in the direction away from the opening portion 11.

Figure 17:
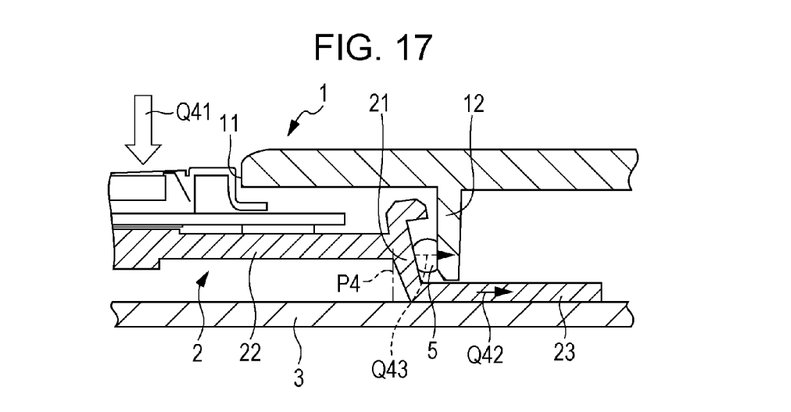
FIG. 17 illustrates transfer of a force in the case where a pressing force is applied to the fingerprint sensor frame according to the third embodiment.

Next, transfer of a force to the fingerprint sensor frame 2 according to the embodiment at the time when the pressing force Q41 is applied to the fingerprint sensor frame 2 is described in detail with reference to FIG. 17. When the pressing force Q41 is applied to the fingerprint sensor frame 2, the upright wall 21 and the extension portion 23 are pressed against the substrate 3. Since the rigidity of the top plate 22 is higher than the rigidity of the upright wall 21, the upright wall 21 is collapsed before the top plate 22 is warped. In other words, the upright wall 21 is moved in the direction away from the opening portion 11 from the position P4 in FIG. 17 to the position indicated in FIG. 17. At this time, the extension portion 23 slides in the direction of the arrow Q42 over the surface of the substrate 3. At this time, a pressing force Q43 is applied to the O-ring 5. This causes the O-ring 5 to be pressed against the annular projection 12.

In the electronic device according to the embodiment, as has been described above, when a force is applied to a member having a seal mechanism that uses an O-ring from the outside toward the inside of a housing, a wall of the member that has received the pressing force is expanded, which increases a force to press the O-ring from both sides to compress the O-ring. This makes it possible to maintain seal performance in the case where a force is received from the outside, and to secure stability in waterproof performance and dust-proof performance.

Fourth Embodiment

Next, an electronic device according to a fourth embodiment is described. The electronic device according to the embodiment is obtained by combining the structure according to the first embodiment and the structure according to the third embodiment.

Figure 18:
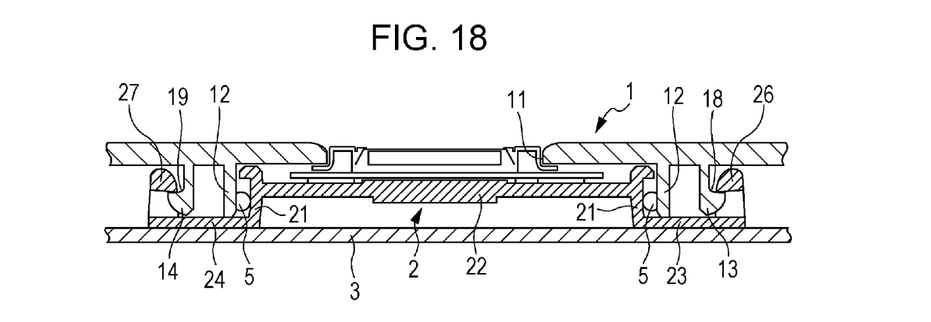
FIG. 18 is a cross-sectional view of an electronic device according to a fourth embodiment.

FIG. 18 is a cross-sectional view of the electronic device according to the fourth embodiment. The fingerprint sensor frame 2 according to the embodiment is structured in the same manner as that according to the first embodiment. In addition, the rear case 1 according to the embodiment is structured in the same manner as that according to the first embodiment. Further, the substrate 3 of the electronic device according to the embodiment supports the extension portions 23 to 25 of the fingerprint sensor frame 2 from the side opposite to the rear case 1 as in the third embodiment.

In the electronic device according to the embodiment, in the case where a pressing force is applied to the fingerprint sensor frame 2 from the rear case 1 side, the extension portions 23 to 25 are slidably moved over the substrate 3, and the upright wall 21 is moved in the direction away from the opening portion 11. This causes the O-ring 5 to be pressed against the annular projection 12.

Since the hooks 13 to 15 and the hook receivers 26 to 28 engage with each other, respectively, lateral displacement of the fingerprint sensor frame 2 can be reduced in the case where the extension portions 23 to 25 slide over the substrate 3. Even if the substrate 3 is warped, a rotational force exerted about contact points at which the hooks 13 to 15 and the hook receivers 26 to 28 engage each other, respectively, is applied to the upright wall 21. Therefore, the O-ring 5 is pressed against the annular projection 12.

In the electronic device according to the embodiment, as has been described above, when a force is applied to a member having a seal mechanism that uses an O-ring from the outside toward the inside of a housing, a wall of the member that has received the pressing force is expanded, which increases a force to press the O-ring from both sides to compress the O-ring. This makes it possible to maintain seal performance in the case where a force is received from the outside, and to secure stability in waterproof performance and dust-proof performance.

In addition, lateral displacement of the fingerprint sensor frame caused in the case where the extension portions slide over the substrate is reduced. Thus, the positional relationship between the fingerprint sensor and the housing in the direction in which the extension portions slide can be maintained, which suppresses a reduction in fingerprint reading accuracy.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An electronic device comprising:
a housing including an opening portion and an annular projection provided in the vicinity of the opening portion from the housing, and the annular projection projects so as to surround a periphery of the opening portion;
a frame member including a tubular portion having an outer surface that faces the annular projection to be fitted with the annular projection, a top plate exposed from the opening portion with the tubular portion fitted with the annular projection, and an extension portion extending from the outer surface of the tubular portion, the tubular portion being expanded toward the annular projection when a pressing force is applied to a surface of the top plate exposed from the opening portion with the annular projection and the tubular portion fitted with each other; and
an O-ring that contacts entire peripheries of the outer surface of the tubular portion and an inner surface of the annular projection,
wherein when the pressing force is applied to the surface of the top plate, the O-ring is pressed directly against the annular projection and compressed so that a seal is strengthened to keep waterproof property and dust-proof property.
2. The electronic device according to claim 1,
wherein the housing includes a hook provided on a side on which the annular projection is disposed and on an outer side of the annular projection, and
the frame member includes a hook receiver that extends toward the housing from the extension portion to engage with the hook of the housing.
3. The electronic device according to claim 2,
wherein the hook is provided on an inclination which is disposed at a position farther from the opening portion than the annular projection and at which the hook faces the extension portion of the frame member, the projection projecting toward the extension portion.
4. The electronic device according to claim 2,
wherein at least two said extension portions are provided, and the two extension portions extend in directions opposite to each other.
5. The electronic device according to claim 4,
wherein the two extension portions extend on the same line.
6. The electronic device according to claim 1, further comprising:
a support member that slidably supports the extension portion of the frame member from a side opposite to the housing.
7. The electronic device according to claim 1,
wherein the tubular portion is expanded in a direction of extension of the extension portion as the tubular portion extends toward the extension portion.
8. The electronic device according to claim 1,
wherein an inner surface of the tubular portion is inclined to be expanded in a direction of extension of the extension portion as the tubular portion extends toward the extension portion, and the tubular portion becomes thinner toward the extension portion.
9. The electronic device according to claim 1,
wherein the top plate has high rigidity compared to the tubular portion.

* * * * *